(12) United States Patent
Oh

(10) Patent No.: US 6,445,641 B1
(45) Date of Patent: Sep. 3, 2002

(54) MEMORY DEVICE WITH TIME SHARED DATA LINES

(75) Inventor: Jong-Hoon Oh, Fremont (KR)

(73) Assignee: G-Link Technology, Milpitas, CA (US)

( * ) Notice: Subject to any disclaimer, the term of this patent is extended or adjusted under 35 U.S.C. 154(b) by 0 days.

(21) Appl. No.: 09/654,147

(22) Filed: Sep. 1, 2000

Related U.S. Application Data

(60) Provisional application No. 60/152,037, filed on Sep. 2, 1999.

(51) Int. Cl.$^7$ ................................................. G11C 8/00
(52) U.S. Cl. ................................. 365/230.08; 365/233
(58) Field of Search ....................... 365/230.08, 230.06, 365/233, 194, 230.02

(56) References Cited

U.S. PATENT DOCUMENTS

| | | | | |
|---|---|---|---|---|
| 5,612,922 A | * | 3/1997 | McLaury | 365/230.05 |
| 5,655,105 A | * | 8/1997 | McLaury | 395/496 |
| 5,657,287 A | * | 8/1997 | McLaury et al. | 365/230.01 |
| 5,659,518 A | * | 8/1997 | McLaury | 365/230.05 |
| 5,717,904 A | * | 2/1998 | Ehlers et al. | 395/511 |
| 5,793,688 A | * | 8/1998 | McLaury | 365/203 |
| 5,896,339 A | * | 4/1999 | McLaury | 365/230.02 |
| 6,011,727 A | * | 1/2000 | Merritt et al. | 365/189.02 |
| 6,021,084 A | * | 2/2000 | McLaury | 365/230.02 |
| 6,130,856 A | * | 10/2000 | McLaury | 365/233 |

* cited by examiner

*Primary Examiner*—Richard Elms
*Assistant Examiner*—Anh Phung
(74) *Attorney, Agent, or Firm*—Babak S. Sani; Townsend and Townsend and Crew LLP

(57) ABSTRACT

A memory device having an array of memory cells distributed into rows and columns with a plurality of interconnects extending across the array and coupled to carry write data during a first period of time and control data during a second period of time. In some embodiments where data I/O pads, input buffers, I/O sense amplifiers, write drivers, and color registers are collectively located on an opposite side of the array away from column decoders, column pre-decoders and column redundancy circuits, time-sharing of write data and control data on a single bus significantly improves layout efficiency.

25 Claims, 4 Drawing Sheets

MEMORY DEVICE WITH TIME SHARED DATA LINES

CROSS REFERENCE TO RELATED APPLICATIONS

This application is a non-provisional application which claims priority from U.S. Provisional Application Ser. No. 60/152,037 filed Sep. 2, 1999, the disclosure of which is incorporated herein by reference for all purposes.

BACKGROUND OF THE INVENTION

The present invention relates in general to semiconductor memories and in particular to a memory device that allows I/O buses to be shared between data and control information.

For certain electronic applications, memory devices provide the capability of simultaneously writing large blocks of data. An example is the use of random access memory (RAM) circuitry in graphics applications. A video graphics system typically uses a RAM to store data that represent the color or intensity of light for every picture cell (pixel) on the video screen. Frequently, adjacent pixel groups display exactly the same information within a graphic output, such as a screen display. To decrease the number of write cycles required to fill the memory with such data, the video RAM is capable of writing the same data simultaneously in multiple adjacent column addresses. This function is commonly referred to as a "block write" operation. A graphics memory device, such as a RAM, typically includes color registers which store write data during block write operations. A block write operation may involve writing, for example, 16 columns at a time wherein address bits A<7:4> are decoded for addressing column cells and bits A<3:0> are disregarded according to industry standards.

Also, some graphics applications support what is called "masking functions." Such functions can occur during a normal write operation (i.e., write per bit mode) whereby individual masked bits permit memory locations to keep their original data, even if addressed for writing. Masking operations performed during block write can mask one or more entire columns. A single masking bit that masks a certain column is referred to as a "column mask bit." The column mask bits ("CMBs") are supplied through the data I/O ("DQ") pins and are typically decoded by the column decoder similar to normal column address bits.

Architecturally, a memory device, such as a RAM circuit, is typically arranged in several identical memory arrays with each array including a matrix of memory cells located at intersections of a number of columns, or bit lines, ("BLs") and rows, or word lines ("WLs"). A 256 Meg dynamic RAM (DRAM), for example, may be divided into four banks, with each bank divided into two blocks and each block made up of 32 memory arrays, each array including 2 Megs of memory cells located at intersections of 1024 bit line pairs and 512 word lines.

FIG. 1 shows a simplified example of a layout architecture for a memory block. Cell array 100 corresponds, for example, to a block of memory that is made up of multiple smaller arrays 110. Block 102, which includes data I/O pads ("DQ" pads) as well as data input buffers, is typically placed at one end of the array. Another block 104 includes I/O sense amplifiers and write drivers. In graphics DRAMs, block 104 may also include color registers for holding block write data where such registers are usually disposed between the DQ pads/input buffers and the cell array. Column redundancy circuitry 112 for replacing defective memory cells, and column decoder 106, are typically placed on the other side of array 100 with I/O buses 108 extending vertically across the array.

This type of memory organization, which is commonly found in memory devices, creates layout inefficiencies in certain applications. For example, column mask bits (CMBs) which are supplied by the data input buffers in block 102 must traverse cell array 100 to reach the column redundancy and column decoder 106. This creates some layout difficulties and increases the array size, and thus the overall size and cost of the memory device.

SUMMARY OF THE INVENTION

The present invention provides methodology and circuitry for time sharing existing interconnects, such as I/O buses, that traverse the cell array to carry both data as well as control information, such as column mask bits. This results in a more compact layout for the memory device which in turn provides for a more cost effective implementation.

According to one embodiment, the present invention includes a memory device having an array of memory cells distributed in rows and columns. Further, a plurality of interconnects extend across the array and are coupled together to carry write data and control data during a first and a second period of time, respectively. In a specific embodiment, the control data includes column mask information for block write operations.

In another embodiment, the present invention includes a method of operating a memory device in block write mode. The process has the steps of receiving column mask information on input nodes located at one end of an array of memory cells and then driving the column mask information onto array-long interconnect lines. The column mask information is received by circuitry across the array of memory cells during a first period of time. Next, write data is driven onto the interconnect lines to supply write data to the memory array cells during a second period of time. The second time period is different than the first time period. For example, column mask bits which prevent certain graphical information from changing on a screen, are driven onto an I/O bus during time, $t_1$. During another time period, $t_2$, color write data for coloring non-masked cells is driven onto the same I/O bus. Thus, a single I/O bus is used with the above time-sharing methodology to multiplex column mask and color write information to provide a more cost effective implementation..

The following detailed description and drawings provide a better understanding of the nature and advantages of the memory device with time-shared I/O lines according to the present invention.

DESCRIPTION OF THE SPECIFIC EMBODIMENTS

The following describes a specific example illustrating how the time-shared I/O bus concept are implemented in the context of a synchronous graphics memory. The general concept of the present invention is applicable to the operation of a variety of memory devices and is not limited to synchronous graphics memories. An exemplary memory device utilizing time-shared I/O buses is described hereinafter in connection with the flow diagram of FIG. 2 to describe a specific embodiment.

The time-sharing concept of the present invention is described hereinafter in the context of a block write operation for an exemplary memory device. Block Write Command Cycle 204 of FIG. 2 initiates a block write operation during which time-sharing of data buses occurs according to one embodiment of the present invention. During this cycle a block write function of the device is enabled and two processes of CMB Set-Up 206 and Color Data Set-Up 226 begin. In another embodiment of Block Write Command Cycle 204, the column address (CA) bits are sampled for later processing in the step of Color Data Set-Up 226.

During the step of CMB Set-up 206, CMBs are sampled at an I/O pin DQ and stored into a data input buffer. The CMBs remain in the buffer until they are driven onto a global I/O bus during the stage of CMBs-onto-GIO 210.

In specific examples, certain aspects of the block write operation are governed by industry standards such as JEDEC. More specifically, JEDEC block write specifications require column address bits CA<3:1> to be excluded from the valid field of column address whereby the group of non-used column address bits CA<3:1> are employed as CMBs during JEDEC block write operations. Where CMBs are recognized as part of the column address field (i.e., as bits CA<3:1>), the sampling of CMBs into the data input buffer occurs substantially at the same time with the sampling and latching of the CA bits prior to or during the step of Color Data Set-Up 226.

In one embodiment, where redundancy techniques are used, the CMBs are incorporated as part of the column redundancy program. Hence, the updated CMBs and remaining CA bits (i.e., CA<7:4>) are applied to the column redundancy circuitry to identify which normal or redundant column is selected.

During the process of Color Data Set-up 226, color write is updated before it is transported in the cycle of Color Data Transport 230. First, Column Address Cycle 220 samples and latches the CA inputs into an address buffer thereby selecting the destination across the array where color data is to be written. In one embodiment, this cycle is equivalent to a normal write command cycle. In another embodiment, Color Data Set-up 226 occurs somewhat in parallel with the cycles of CMB Set-up 206 and CMB Transport 212.

Figure 1:
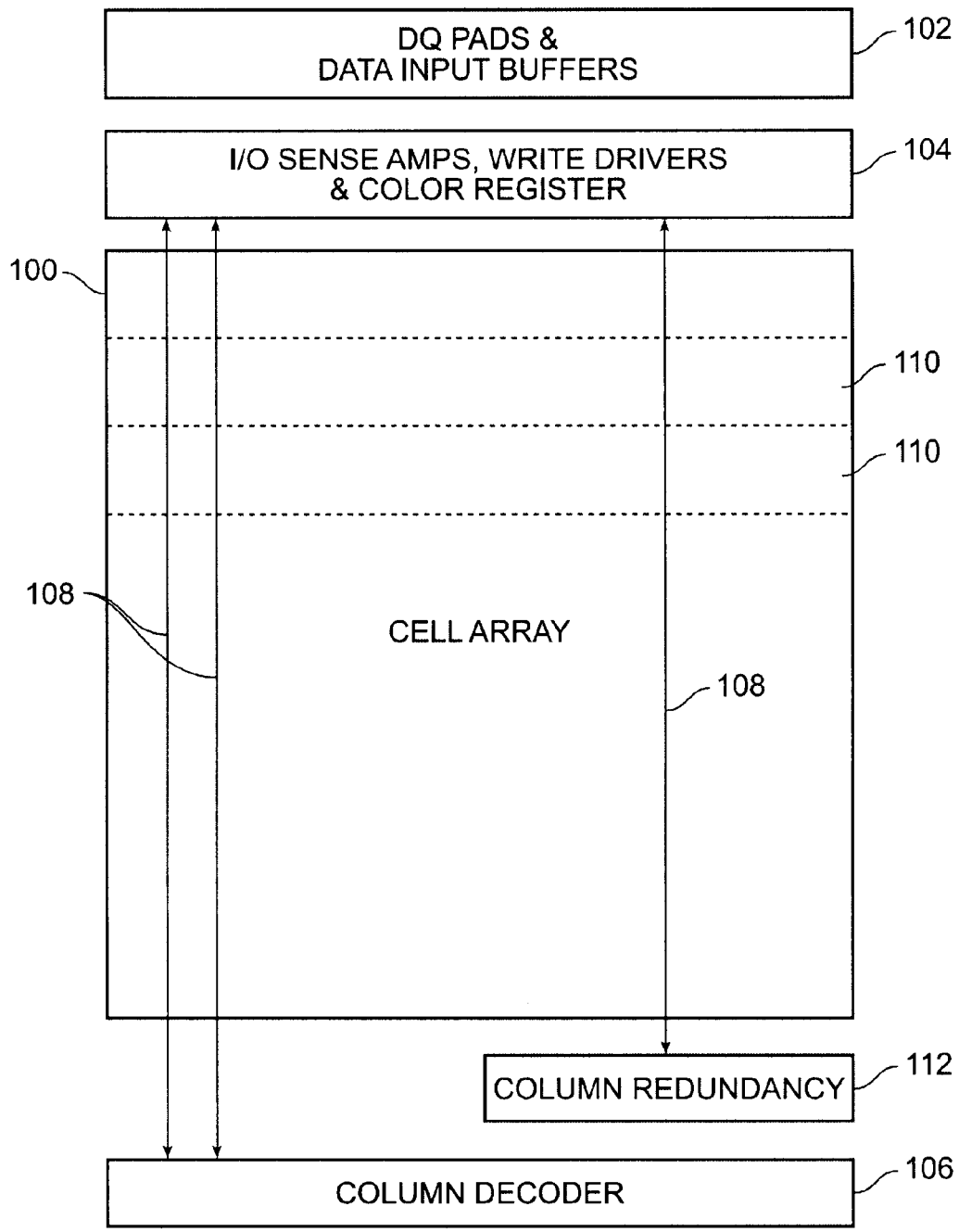
FIG. 1 shows a simplified layout architecture for a memory array.

The step of GYA Channel Update 222 follows Column Address Cycle 220, wherein "GYA channel" refers to the global y-address channel. After the sampled column address (CA) bits are latched in the address buffer, the CA bits are driven onto the GYA channel and to a column decoder across the array. For example, GYA driver in block 104 of FIG. 1 drives the CA to a selected column decoder 106 on the other side of the array. Upon completion of GYA Channel Update 222, addressed column decoder 106 points to the memory cell or cells where updated color data is to be placed. In one embodiment of this step, this operation occurs substantially in parallel with CMB transport 212.

Also during Color Data Set-up 226, the step of Load Color Register 224 operates to latch color data into a color data register and is performed before Color Data Transportation 230. In operation, the function and the timing of the color register load is similar to register loads in normal write command cycles in other memory devices. In this exemplary device, Load Color Register 224 follows Column Address Cycle 220 and is synchronized substantially with the driving of the CA bits onto the GYA channel during GYA Channel Update 222. In another embodiment, the cycle of Load Color Register 224 occurs substantially with the sampling of the CA bits during Block Write Command Cycle 204.

Following CMB Set-up 206, CMB Transport Phase 212 provides for the driving of the CMBs from the global I/O bus to a write driver. After CMB data arrives at a write driver input, it resides there until the driver is triggered to drive the CMBs onto a data bus. The CMB data is then delivered from the data bus to a CMB register located at the far side of array at the bank I/O block, where the data is latched into the register.

In one embodiment, the time-sharing methodology complies with the double data rate ("DDR") specifications. That is, the CMB transport phase is optional and is disabled. According to one embodiment, the present invention provides for a re-mapping of the global I/O bus for efficient CMB transport. In another embodiment, since the CMBs latched into bits CA<3:1> are recognized as part of the column address field, the transportation of CMBs substantially occurs with GYA Channel Update 222.

Color Data Transport 230 follows CMB Transport Phase 212 and provides for transportation of the color data, which was loaded into a color register by the previous step of Load Color Register 224. During the step of MUX color data 228, the color data is transferred from the color register to the input stage of the same write driver set used in the previous stage of CMB Transport 212. In one embodiment of this step, the color data is then transported at a different time than the transport of the CMB data and thus time-shares the same means of transportation, such as a data bus (e.g., M2_DB). In another embodiment of this step, mask write features become enabled to operate bit-masking according to the mask information stored in mask registers located in the bank I/O block.

Finally, after the color data has been transported onto the data bus, the color is written into non-masked address locations during the step of Write Color Data 234. Thus, masked address locations retain their previous color data while non-masked address locations will be updated with new graphics data.

Figure 3:
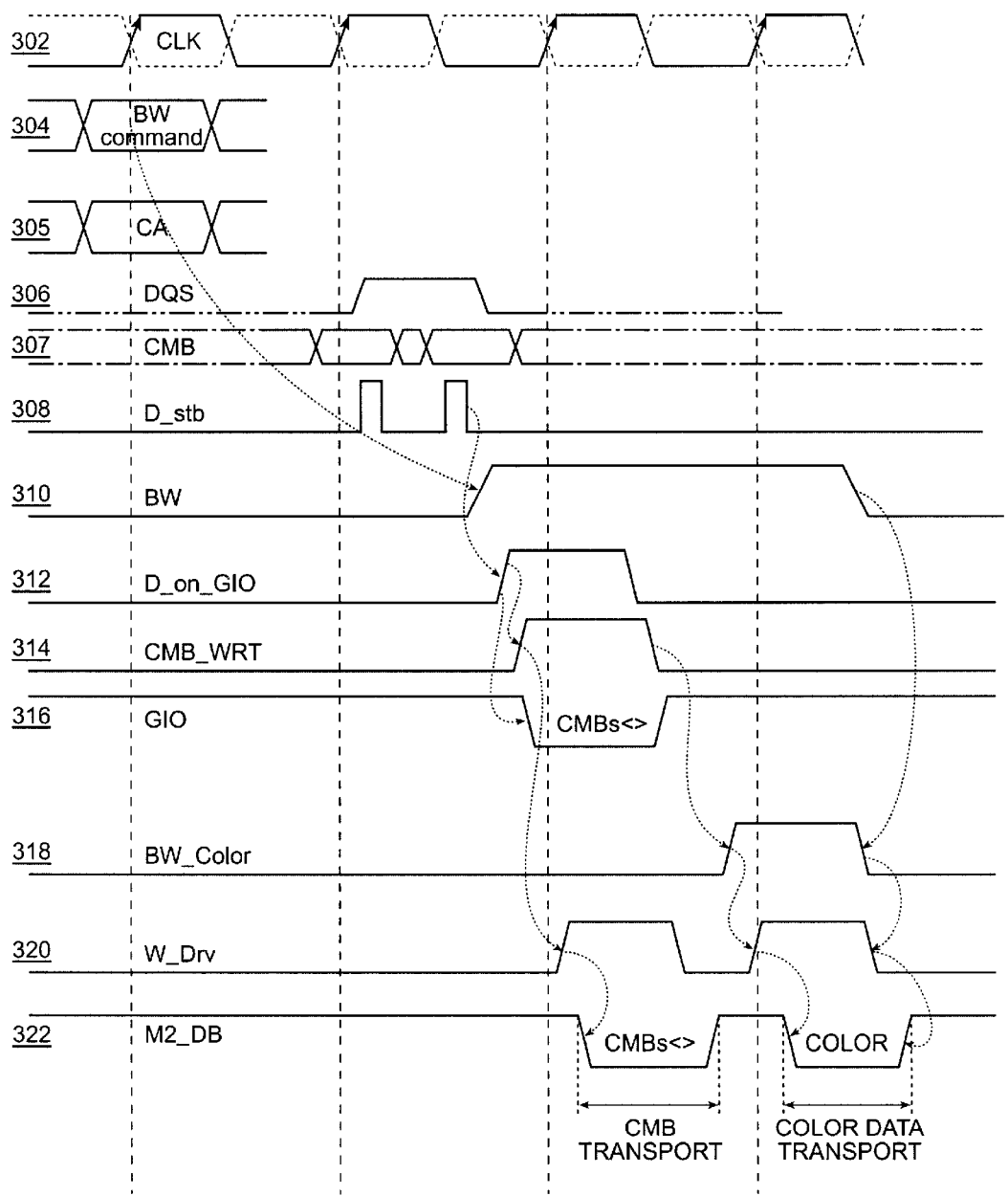
FIG. 3 is a timing diagram illustrating the operation of the memory device according to an exemplary embodiment of the present invention.
Figure 4:
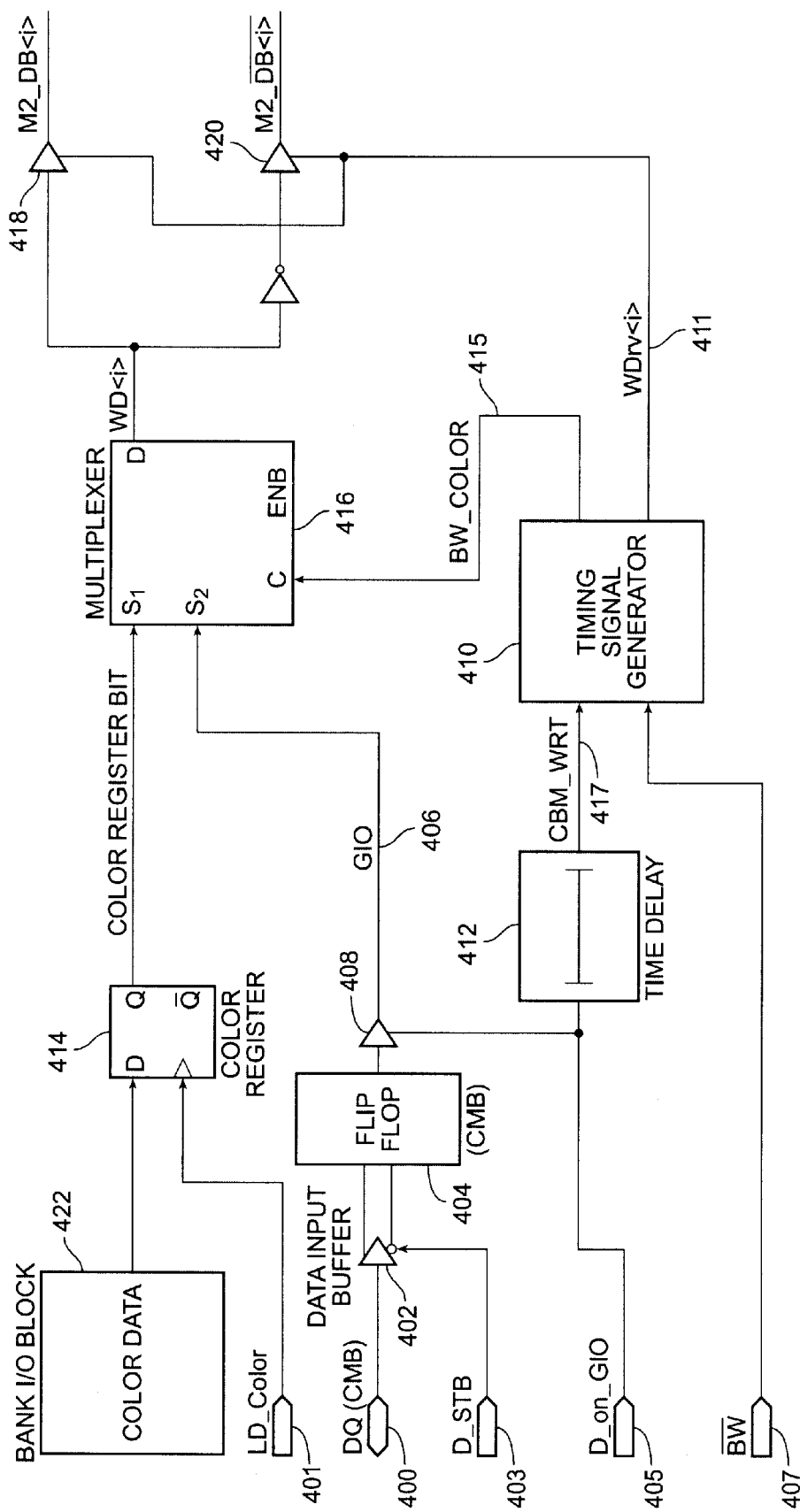
FIG. 4 shows an exemplary circuit for implementing the time-shared I/O bus according to the present invention.

An exemplary circuit according to the present invention is discussed below in the context of FIGS. 3 and 4. FIG. 4 is a simplified circuit diagram showing the relevant portions of the circuitry embodying the time-shared data buses. FIG. 3 illustrates an exemplary timing diagram. It shows the relative timing of the signals making up the Set-Up and Transportation phases of both the CMB data and color data as realized in the circuit shown in FIG. 4.

The time-sharing methodology is initiated during the first command cycle coinciding with system clock CLK 302 of FIG. 3, where a command decoder (not shown) decodes and then asserts a Block Write ("BW") 310 command signal. This step is associated with Block Write Command Cycle 204 of FIG. 2 and enables bit-masking based on the column mask bit information stored in mask registers. As described above, BW 310 is a write command which enables performance of two processes, CMB Set-Up and Color Data Set-Up.

CMB Set-Up is realized in a portion of an exemplary circuit shown in FIG. 4, wherein CMB data is sampled and stored into a data input buffer. During BW operation, a dedicated I/O pin DQ 400 is configured to receive and to transmit CMB data. The CMB data sampled at DQ 400 is stored in data input buffer 402.

Data input buffer 402 is adapted to receive a control signal D_Stb 403 and is configured further to latch the CMB data into flip-flop 404 where it remains until driven onto global I/O bus ("GIO") 406. Driver 408 is electrically coupled to receive driver control signal D_On_GIO 405 as well as the CMB data from flip-flop 404. Driver 408, in response to control signal D_On_GIO 405, delivers the latched CMB data onto GIO bus 406. Additionally, and substantially concurrent with the enabling of driver 408, time delay circuitry 412 is configured to receive D_On_GIO 405. This delay circuitry is self-timed to begin the CMB Transport phase by generating and outputting a control signal after a predetermined time has elapsed. The control signal generated by time delay circuitry 412 is CMB_WRT 417.

The timing relationship between the signal processed by the above circuit elements is illustrated in FIG. 3. During Block Write operation, and after a pre-determined time delay following the first command cycle 304, signal DQS 306 enables CMB data 307 to be sampled at the I/O pin DQ during part of CMB Input Cycle. Also during CMB Input Cycle, CMB data 307 is sampled into a data input buffer and latched into a flip flop by strobe D_Stb 308.

Next, in the step of CMB-onto-GIO, driver control signal D_on_GIO 312 is applied to both driver 408 and time delay circuit 412. Driver 408 drives the CMB data onto the GIO bus at stage CMB-onto-GIO 210 of FIG. 2. The timing signal D_On_GIO 405 of FIG. 4 is associated with D_On_GIO 312 of FIG. 3. In one embodiment, D_On_GIO 312 is generated after a second edge of D_Stb 308 in each BW operation. In another embodiment, D_On_GIO 312 is used to generate CMB_WRT 314 after a user-defined delay.

Figure 2:
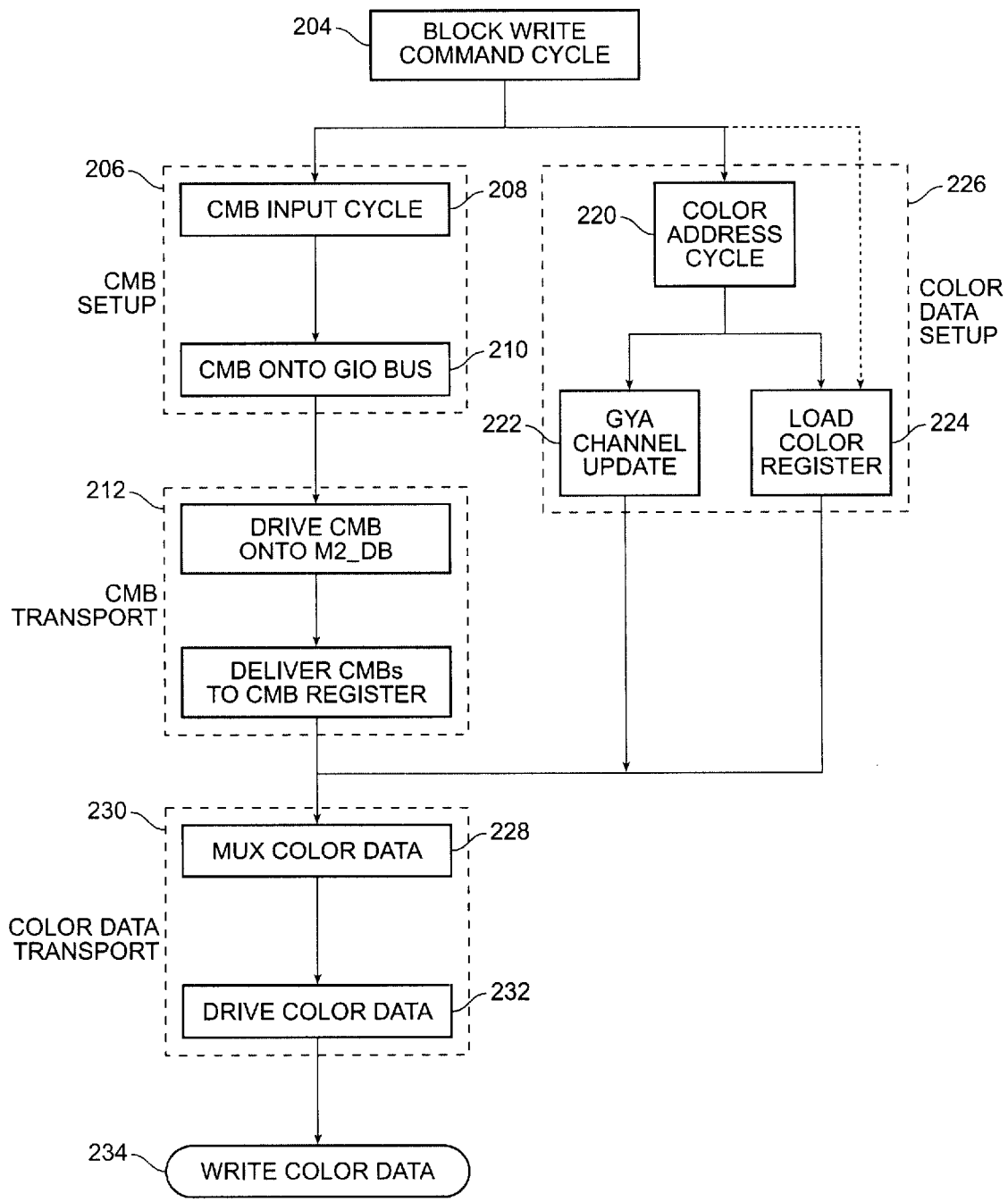
FIG. 2 is a flow diagram illustrating a method of sharing I/O lines between data and control information according to one embodiment of the present invention.

Referring back to FIG. 4, the Color Data Set-Up phase of the present invention uses another portion of the illustrative circuit, wherein a color register 414 is configured to receive color data from the Bank I/O Block 422 and is adapted to receive a control signal LD_Color 401 for loading the register with color data. The loading of data into color register 414 occurs during Color Data Set-Up, as described regarding FIG. 2. Furthermore, color register 414 is configured to deliver color register bits to multiplexer 416. The associated circuits realizing the steps of Column Address Cycle and GYA Channel Update of FIG. 2 are well known in the art, and are not shown. With respect to timing, FIG. 3 depicts the exemplary timing of the step of Column Address Cycle, wherein the column address CA 305 is sampled during the BW command cycle 304. FIG. 3, however, does not show the timing of the step of GYA Channel Update, since it too is well known in the art.

Multiplexer (MUX) 416, such as a 2:1 MUX, operates to select either one of the CMBs on GIO 406, or alternatively, the block write color data bits at the output of color register 414. MUX 416 is configured to receive a MUX control signal BW_COLOR 415 and is configured further to gate the selected data (i.e., CMB or color data) onto the complementary data bus line M2_DB<i> and M2_DB#<i> via drivers 418 and 420, respectively. Drivers 418 and 420 are both adapted to receive a control signal WDrv<i> 411 which enables the drivers to drive the selected data onto M2_DB.

MUX control signal BW_COLOR 415 and control signal WDrv<i> 411 are generated by timing signal generator 410. Timing signal generator 410 is coupled to receive signal BW 407 and to deliver the respective control signals to the MUX and to the drivers. In this example, time signal generator 410 is enabled by BW 407 to generate the control signals for the MUX and drivers when block write mode is selected and the generator receives signal BW 407.

In the CMB Transport phase, the CMB data is selected to pass from the GIO bus, through MUX 416, to the input of write drivers 418 and 420. Referring back to FIG. 3, CMB transportation is initiated by MUX control signal BW_Color 318. For example, after CMB data is driven onto the GIO bus as shown by GIO 316, a low BW_Color 415 signal generated by the timing signal generator causes the MUX to selectively pass GIO bus data (i.e., CMB data) through the MUX. After a pre-determined time has elapsed, such as the time required for CMB data to stabilize at the M2_DB write driver inputs, control signal WDrv 320 triggers the complementary write drivers to drive CMB data, via M2_DB 322, to the CMB registers located in block 106 of FIG. 1. Once the CMB registers are latched with CMB data, the column mask bits selectively disable the part of global column decoders (GCDs) that will be masked, thus preventing data from being written to masked locations. With this, the CMB Transport phase is concluded.

The Color Data Transport phase of the present invention uses similar portions of the illustrative circuit in FIG. 4 as does the CMB Transport phase, as described above. The color data information is selected to pass through MUX 416 to the input of write drivers 418 and 420 when BW_Color 415, for example, is high. The timing of BW_Color 415 is such that CMB data stabilizes and is driven out from the write drivers before the color data arrives at the input stage of complementary drivers 418 and 420. Once color data is stabilized at the input stages, the timing signal generator 410 generates another WDrv<i> 411 signal, which triggers the write drivers to drive the color data bit onto the M2_DB 322 data bus. From the data bus, the color bit is at last written to selected memory cell groups which use the bit-making features.

Referring back to FIG. 3, the timing of the above phase begins when BW_Color 318 changes to another state, for example a high state as shown in FIG. 3. The previously loaded color data in the color register is first selected by the MUX and then is gated to the input stage of the same write driver pair as used in the CMB Transport phase. In one embodiment, BW_Color 318 changes to a high state after a pre-determined time after the timing signal generator causes CMB_WRT 314 to go low. That is, BW_Color 318 is triggered by the falling edge of CMB_WRT 314 as shown in FIG. 3. In another embodiment, the falling edge of BW 310 causes BW_Color 318 to change to a low state, thus ending the Color Data Transport phase.

As stabilized color data resides at the input stage of the write driver, the timing signal generator outputs another W_Drv 320 signal, which in turn triggers the write drivers to finally drive the color data onto the M2_DB data bus, as shown by the timing of M2_DB 322. This step occurs during Drive Color Data 232 of FIG. 2 and thus concludes the Color Data Transport phase. After the color data has been transported onto the data bus, control signal Write Color Data 234 of FIG. 2 permits the color data bits to be written into non-masked address locations.

While the above provides a detailed description of a specific embodiment of the present invention, there are other alternatives and modifications. The scope of the invention is therefore not limited by the exemplary implementation described above, and is instead defined by the following claims.

What is claimed is:

1. A memory device comprising:
   an array of memory cells distributed in rows and columns;
   a plurality of interconnects extending across the array and coupled to carry write data during a first period of time and control data during a second period of time, wherein, the control data includes column mask information for block write operations.

2. The memory device of claim 1, further comprising a first block including data I/O pads and input buffers, and a second block including I/O sense amplifiers, write drivers, and color registers, wherein the first block is located adjacent to the second block.

3. The memory device of claim 2, wherein the first block and the second block are located adjacent to a first side of the array of memory cells, the second block located closer to the first side of the array of memory cells.

4. The memory device of claim 3, further comprising a third block including column decoders, column pre-decoders and column redundancy circuits, wherein the third block is located adjacent to a second side of array of memory cells.

5. The memory device of claim 4, wherein the plurality of interconnects electrically coupling the first block and the second block on the first side to the third block on the second side.

6. The memory device of claim 1 further comprising:
data input circuitry located adjacent a first side of the array of memory cells and coupled to receive write data and to drive write data onto the plurality of interconnects;
column decode circuitry located adjacent a second side of the array across the first side of the array, and coupled to the plurality of interconnects.

7. The memory device of claim 6 further comprising write control circuitry coupled to the data input circuitry and configured to control the flow of column mask information and write data on the plurality of interconnects.

8. The memory device of claim 7 wherein the write control circuitry comprises a selection circuit having a first input coupled to receive one of either write data or column mask information, a second input coupled to receive color data, a selection control input coupled to a selection control signal, and an output.

9. The memory device of claim 8 further comprising a color data register coupled to the second input of the selection circuit and configured to store color data.

10. The memory device of claim 9 wherein the write control circuitry further comprises a timing signal generator coupled to receive a first timing signal derived from a block write command signal and a second timing signal derived from a data strobe signal, and configured to generate the selection control signal.

11. The memory device of claim 10 further comprising a plurality of interconnect drivers, respectively coupled to drive the plurality of interconnects.

12. The memory device of claim 11 wherein a predetermined one of the plurality of interconnects is configured to carry column mask information, and wherein its respective driver receives a control signal from the timing signal generator.

13. A method of operating a memory device comprising the steps of:
receiving column mask information on input nodes located at one end of an array of memory cells;
driving column mask information onto array-long interconnect lines to supply column mask information to circuitry across the array of memory cells during a first period of time; and
driving write data onto the interconnect lines to supply write data to the array of memory cells during a second period of time that is different than the first period of time.

14. The method of claim 13, wherein the step of receiving column mask information further comprises the steps of:
sampling the input nodes for receiving column mask information;
storing the information in a data input buffer; and
driving the column mask information onto a global I/O bus.

15. The method of claim 14, wherein the step of driving column mask information further comprises the steps of:
multiplexing the column mask information from the global I/O bus to a write driver input stage; and
driving the information onto array-long interconnect lines during the first period of time.

16. The method of claim 15, wherein the step of driving write data further comprises the steps of:
setting up the write data;
multiplexing the write data from the global I/O bus to a write driver input stage; and
driving the write data onto array-long interconnect lines during the second period of time.

17. The method of claim 16, wherein the step of setting up the write data further comprises the steps of:
sampling address of location for depositing data;
loading a register with the write data; and
updating selected address of location where write data is to be deposited.

18. The method of claim 16, wherein the write data comprises color data.

19. The method of claim 13, wherein the second period of time write data further comprises the steps of:
sampling the first period of time to detect an end to the period;
detecting the end to the period;
generating a self-timed signal to begin the second period of time;
beginning the second period of time; and
ending the second period after a pre-determined time.

20. A memory device comprising:
an array of memory cells distributed in rows and columns;
a plurality of write drivers located on a first side of the array and coupled to data input pads;
a plurality of data buses coupled to the plurality of write drivers and extending across the array coupling to the memory cells inside the array;
a column decoder array located on a second side opposite to the first side of the array and coupled to the plurality of data buses; and
block write control circuit coupled to a predetermined write driver and configured to deliver column mask information to the predetermined write driver to be driven onto a respective data bus during a first period of a block write operation, and to deliver a corresponding color data to the predetermined write driver to be driven onto the respective data bus during a second period of the block write operation.

21. The memory device of claim 20 further comprising a color data register coupled to the block write control circuit and configured to store color data.

22. The memory device of claim 21 wherein the block write control circuit comprises a multiplexer having a first input coupled to the color data register, a second input coupled to a predetermined data input pad, a control input and an output coupled to the predetermined write driver.

23. The memory device of claim 22 wherein the block write control circuit further comprises a timing signal generator having a first input coupled to receive a first timing signal derived from a block write command signal, a second input coupled to receive a second timing signal derived from a data strobe signal, and a first output coupled to the control input of the multiplexer.

24. The memory device of claim 23 wherein the timing signal generator generates a timing control signal at a second output coupled to control input of the predetermined write driver.

25. The memory device of claim 24 wherein the second input of the multiplexer receives data mask information from the predetermined data input pad during the block write operation, and receives write data during normal write operation.

* * * * *